United States Patent [19]

Claasen et al.

[11] Patent Number: 4,517,655

[45] Date of Patent: May 14, 1985

[54] MULTIPLIER CIRCUIT FOR MULTIPLYING AN INFORMATION SIGNAL BY A PERIODIC SIGNAL

[75] Inventors: Theodoor A. C. M. Claasen; Albert J. Stienstra; Arthur H. M. van Roermund, all of Eindhoven, Netherlands

[73] Assignee: U.S. Philips Corporation, New York, N.Y.

[21] Appl. No.: 416,737

[22] Filed: Sep. 10, 1982

[30] Foreign Application Priority Data

Oct. 14, 1981 [NL] Netherlands .................. 8104668

[51] Int. Cl.$^3$ ............................................. H03C 1/00
[52] U.S. Cl. ....................................... 364/703; 375/24
[58] Field of Search .................. 364/703, 841; 375/24, 375/41; 332/31 R

[56] References Cited

U.S. PATENT DOCUMENTS

| | | | |
|---|---|---|---|
| 3,611,143 | 10/1971 | Van Gerwen Emmasingel ... | 375/41 |
| 3,869,670 | 3/1975 | Grützmann et al. .................. | 375/41 |
| 4,300,019 | 11/1981 | Toyomaki .......................... | 364/703 |
| 4,320,361 | 3/1982 | Kikkert ............................ | 332/31 R |
| 4,346,354 | 8/1982 | Hanna .............................. | 375/41 |

*Primary Examiner*—David H. Malzahn

*Attorney, Agent, or Firm*—Thomas A. Briody; William J. Streeter; Marianne Rich

[57] ABSTRACT

Multiplier circuit for multiplying an information signal $x(t)$ by a periodic signal $y(t)$ having frequency $f_o$, more specifically for amplitude modulation purposes in a stereo decoder. The multiplier circuit comprises N switching circuits 21(k) wherein $k=0, 1, \ldots N-1$ which are each connected to a clock pulse generator 221, 222 by means of a control channel 25(k) and are each connected to an input of an adder device 28 by means of a signal channel 26(k). In addition, each switching circuit 21(k) receives the information signal $x(t)$. A series of clock pulses $g(k;t)$ is applied to each control channel in such a manner that for the control channel having number k these clock pulses occur at the instants $t_o+k(T_o/N)+iT_o$ wherein $t_o$ represents a constant $T_o=1/f_o$ and $i=\ldots, -2, -1, 0, 1, 2, \ldots$ Each signal channel 26(k) comprises a weighting network 27(k) having a constant weighting factor $W(k)$ defined by the relation $W(k)=y(t_o+k(T_o/N))$. Each control channel 25(k) (or each signal channel 26(k)) incorporates a pulse reshaping circuit 24(k), which converts a pulse applied thereto into a pulse having a width equal to $\tau=T_o/M$ wherein M represents an integer, for example $M=N-1$.

7 Claims, 19 Drawing Figures

| W(k) \ y(t) = N=8 | $\sin 2\pi f_0 kT$ | $1+2\sin 2\pi f_0 kT$ | $1-2\sin 2\pi f_0 kT$ |
|---|---|---|---|
| W(0) | 0 | 1 | 1 |
| W(1) | $\frac{1}{2}\sqrt{2}$ | $1+\sqrt{2}$ | $1-\sqrt{2}$ |
| W(2) | 1 | 3 | -1 |
| W(3) | $\frac{1}{2}\sqrt{2}$ | $1+\sqrt{2}$ | $1-\sqrt{2}$ |
| W(4) | 0 | 1 | 1 |
| W(5) | $-\frac{1}{2}\sqrt{2}$ | $1-\sqrt{2}$ | $1+\sqrt{2}$ |
| W(6) | -1 | -1 | 3 |
| W(7) | $-\frac{1}{2}\sqrt{2}$ | $1-\sqrt{2}$ | $1+\sqrt{2}$ |

MULTIPLIER CIRCUIT FOR MULTIPLYING AN INFORMATION SIGNAL BY A PERIODIC SIGNAL

BACKGROUND OF THE INVENTION (1) Field of the Invention

The invention relates to a multiplier circuit for multiplying an information signal x(t) by a periodic signal y(t), and which is particularly suitable for use in a stereo decoder or in a phase-locked loop (PLL).

(2) Description of the Prior Art

Circuits for multiplying signals are frequently used in, for example, amplitude modulators and amplitude demodulators. For the sake of simplicity, only the amplitude demodulator will be described hereinafter. The following is, however, also applicable to an amplitude modulator.

As is known, the object of an amplitude demodulator is to convert a band-limiter signal $X(nf_o; t)$, whose frequency spectrum is located in a frequency band from $(nf_o-f_1)Hz$ to $(nf_o+f_1)Hz$ into a signal x(n,t), whose frequency spectrum is located in the frequency band from approximately 0 Hz to $f_1$ Hz. The last-mentioned frequency band will be denoted AF-band (Audio Frequency band). In the foregoing, $f_o$ and also $f_1$ is a fixed frequency and n is an integer. In practice $X(nf_o; t)$ will be part of a signal x'(t) which in principle consists of an infinite number of band-limited signals. Consequently, this signal x'(t) might, for example, be mathematically represented as follows:

$$x'(t) = \sum_{n=0}^{\infty} X(nf_o; t) \quad (1)$$

As usually only one of these band-limited signals must be converted to the AF-band (for example only the signal $X(f_o; t)$ which is obtained if n=1), the amplitude modulator comprises a filter which is commonly referred to as a premodulation filter to which x'(t) is applied and which converts this signal into a signal x(t) which comprises only a limited number of these band-limited signals or even only the signal $X(f_o, t)$. Let it be assumed that for x(t) it holds that:

$$x(t) = \sum_{n=0}^{N-1} X(nf_o; t) \quad (2)$$

wherein N is, for example, equal to 8. Let it further be assumed that:

$$X(nf_o; t) = x(n;t) \sin (2\pi nf_o t + \phi_n) \quad (3)$$

If now this signal x(t) is multiplied in the multiplier circuit by a periodic carrier signal y(t) having frequency $f_o$ for which it holds that, for example:

$$y(t) = 2 \sin (2\pi f_o t + \phi_1) \quad (4)$$

a product signal z(t) is obtained which in addition to the signal x(1;t) located in the AF-band further includes N−2 signals which are located around multiples of the frequency $f_o$. By now applying the signal z(t) to a modulation filter which is commonly referred to as a post-modulation filter, those signals which are located around the multiples of the frequency $f_o$ can be suppressed, so that this filter supplies x(1;t) as the output signal.

If now the carrier signal y(t) would indeed vary purely sinusoidally and the multiplier circuit would operate purely linearly, then only the signal x(1;t) would indeed appear in the AF-band. However, in practice it has been found to be impossible to manufacture a purely linear amplifier circuit in a simple and cheap manner. It even appears to be impossible to generate a purely sinusoidally varying carrier signal in a simple manner. The result thereof is that in this demodulation procedure also noise signals are introduced in the AF-band, which may be particularly annoying.

In order to prevent these noise signals from occurring, it is at present general practice to use in storage decoders instead of a sinusoidally varying carrier signal a carrier signal which has the shape of a periodic two-level pulse signal having a pulse repetition rate $f_o$ and which may, for example, be mathematically expressed as:

$$y(t) = b1(2\pi f_o t + \phi) = \text{sign}[\sin (2\pi f_o t + \phi)] \quad (5)$$

$$b1(2\pi f_o t + \phi) = \begin{cases} 1 \text{ for } \sin(2\pi f_o t + \phi) > 0 \\ -1 \text{ for } \sin(2\pi f_o t + \phi) < 0 \end{cases} \quad (6)$$

The output signal z(t) of this multiplier circuit is now defined by the relation:

$$z(t) = x(t) b1(2\pi f_o t + \phi) \quad (7)$$

For the two-level pulse signal defined in (5) there may now be written:

$$b1(2\pi f_o t + \phi) = \frac{4}{\pi} \sum_{i=1}^{\infty} \frac{1}{2i-1} \sin [(2i-1)(2\pi f_o t + \phi)] \quad (8)$$

From this it follows that this two-level pulse signal comprises a signal component having a frequency which is equal to the pulse repetition rate $f_o$. This signal component will be designated the basic component of the pulse signal. In addition to this basic component, this two-level pulse signal comprises signal components having frequencies which are a multiple, in this case an odd multiple, of the pulse repetition rate. Hereinafter such a signal component will be designated, for the sake of brevity, as "harmonic". In this connection, the expression "$n^{th}$ harmonic" then signifies a signal component whose frequency is equal to n times the frequency of the basic component.

If now the signal x(t) indicated in (2) is multiplied by the two-level pulse signal indicated in (8) then also the signals x(3;t), x(5;t), . . . will occur in the AF-band in addition to the signal x(1;t).

In order to prevent the signals x(3;t) from occurring in the AF-band, the corresponding signals $X(3f_o;t)$ will have to be suppressed to a sufficient extent. The requirements then to be imposed on the premodulation filter appear to be so high in practice that only a filter which is hard to integrate and is costly can satisfy these requirements. To be able to alleviate these requirements, Reference 1 (see paragraph C) proposes to generate a carrier signal y(t) which has a frequency spectrum in which two harmonics of the basic component do not occur; for example the second and the third harmonics. To that end, no periodic two-level pulse signal is taken for y(t), but a periodic three-level signal in which there are three discrete amplitude levels; for example the levels $+1$, $0$, $-1$. As $y(t)$ does not comprise now the signal components having the frequencies $2f_o$ and $3f_o$, the signals $X(2f_o;t)$ and $X(3f_o;t)$ are not converted to the AF-band. It is then not necessary for the premodulation filter to suppress these signals, so that, compared with the original filter, this filter may be of a simpler construction. In practice, such a three-level carrier signal is obtained by generating a first and a second two-level pulse signal which each have the pulse repetition rate $f_o$. These two pulse signals can be chosen so that neither of them contains, for example, the second harmonic, but that both signals do contain the third harmonic. As follows, for example, from expression (8) these two two-level pulse signals can be shifted relative to each other so that the third harmonic in the first two-level pulse signal is accurately in anti-phase with the third harmonic in the second two-level pulse signal, so that these third harmonics cancel each other when these two two-level pulse signals are added together, whereby then the three-level signal is obtained at the same time. In a practical embodiment of this multiplier circuit there are to switching circuits, to which the signal $x(t)$ is applied via their signal inputs. In addition, the first two-level pulse signal is applied to one of the switching circuits via a control input and the second two-level pulse signal to the other switching circuit. The signals supplied by the switching circuits are added together in an adder device. This method has the disadvantage that it produces a carrier signal $y(t)$ which is indeed free from all even harmonics, but only one of the unwanted odd harmonics is absent. In a stereo decoder this will be the third harmonic of the 38 kHz subcarrier.

By means of the method proposed in Reference 1 it is possible to generate, starting from two two-level pulse signals, a so-called "multi-level" signal $y(t)$ which is free from, for example, all the event harmonics, and one odd harmonic. A different method of generating, starting from two-level pulse signals, a multi-level signal $y(t)$ which is free from one or more predetermined harmonics, amounts to the following. Starting from the assumption that $y(t)$ must have a repetition rate $f_o$, a first two-level pulse signal is generated having the pulse repetition rate $f_o$ and which does not contain the unwanted harmonics (let it, for example, be assumed that this pulse signal does not contain the even harmonics). If $y(t)$ must now also be free from the odd $n^{th}$ harmonic (for example $n=3$), then a second two-level pulse signal is generated, whose pulse repetition rate is equal to the frequency $nf_o$ of the $n^{th}$ harmonic to be eliminated. The phase of this second pulse signal can be chosen so that its basic component is accurately in anti-phase with the harmonic to be eliminated in the first pulse signal. In a practical embodiment of this method each two-level pulse signal generated thus is applied to the control input of a corresponding switching circuit. Each switching circuit receives the signal $x(t)$ via a signal input. The signals produced by the switching circuits are added in an adder device after having been multiplied by a predetermined weighting a first two-level pulse signal is generated having the pulse repetition rate $f_o$ and which does not contain the unwanted harmonics (let it, for example, be assumed that this pulse signal does not contain the even harmonics). If $y(t)$ must now also be free from the odd $n^{th}$ harmonic (for example $n=3$), then a second two-level pulse signal is generated, whose pulse repetition rate is equal to the frequency $nf_o$ of the $n^{th}$ harmonic to be eliminated. The phase of this second pulse signal can be chosen so that its basic component is accurately in anti-phase with the harmonic to be eliminated in the first pulse signal. In a practical embodiment of this method each two-level pulse signal generated thus is applied to the control input of a corresponding switching circuit. Each switching circuit receives the signal $x(t)$ via a signal input. The signals produced by the switching circuits are added in an adder device after having been multiplied by a predetermined weighting factor. The value of the weighting factor follows from expression (8) and is equal to $1/n$.

With this method it is not only possible to generate with the aid of two-level pulse signals a multi-level signal $y(t)$ in which the second and the third harmonics are absent, but a multi-level signal $y(t)$ can even be obtained which in addition is free from the fourth and the fifth harmonics etc. In the last few years this property has appeared to be of considerable importance for stereo decoders, the reason being that it is increasingly tried to accommodate the complete stereo decoder on one IC and to avoid the use of a costly pre-modulation filter. As over the years the number of transmitters providing stereophonic wireless transmissions has increased very considerably, also the number of parasitic signals which may be converted to the AF-band has become increasingly larger. For example, in the expression (7) the quantity N may have the value seven, or even nine. By means of the last-described method it is indeed possible to avoid a simple premodulation filter having to be replaced again by a costly filter, but from Reference 2 it appears that a suitable implementation of this method for generating a multi-level signal $y(t)$ which does not include a plurality of predetermined harmonics results in a very complicated and expensive circuit which for reasons of economy cannot be used in consumer equipment and which furthermore cannot be integrated on only one IC.

SUMMARY OF THE INVENTION

The invention has for its object to provide a novel concept of a multiplier circuit which is of a simple structure and is very suitable for manufacture in the form of an integrated circuit; which does not convert at least those signals whose frequency spectra are located around the frequencies $nf_o$ for $n=2, 3, 4, 5, \ldots N-1$ to the AF-band and whereby no special requirements need be imposed on the premodulation filter.

According to the invention this multiplier circuit therefore comprises:

(a) a pulse generator circuit for generating N periodic pulse signals $g(k;t)$ wherein $k=0, 1, 2, 3, \ldots N-1$, N being at least equal to three and wherein:

a.1. each pulse signal has a pulse repetition rate $T_o = 1/f_o$ a.2. the pulses in the pulse signal $g(k;t)$ occur at instants $t_o + k(T_o/N) + iT_o$, wherein $t_o$ represents a constant and $i = \ldots -1, 0, 1, 2, \ldots$ (b) N switching circuits each having:

b.1. a control input which by means of a control channel is connected to the pulse generator for receiving a pulse signal;

b.2. an information signal input for receiving the information signal $x(t)$;

b.3. a signal output connected to a signal channel;

(c) N weighting networks each having a constant weighting factor and each producing a product signal, each signal channel comprising such a weighting network;

(d) an adder device connected to the signal channels to add up the product signals;

(e) N pulse reshaping circuits for converting a pulse applied thereto into a pulse whose width is equal to an integral fraction times $1/f_o$, each channel formed by the cascade arrangement of a control channel, the associated switching circuit and the signal channel connected thereto including such a pulse reshaping circuit.

REFERENCES

1. German Offenlegungsschrift No. 25 13 228; this is equivalent to United States Patent Specification No. 3,962,551.
2. United Kingdom Patent Application No. 2,020,519A.

SHORT DESCRIPTION OF THE FIGURES

Figure 13:
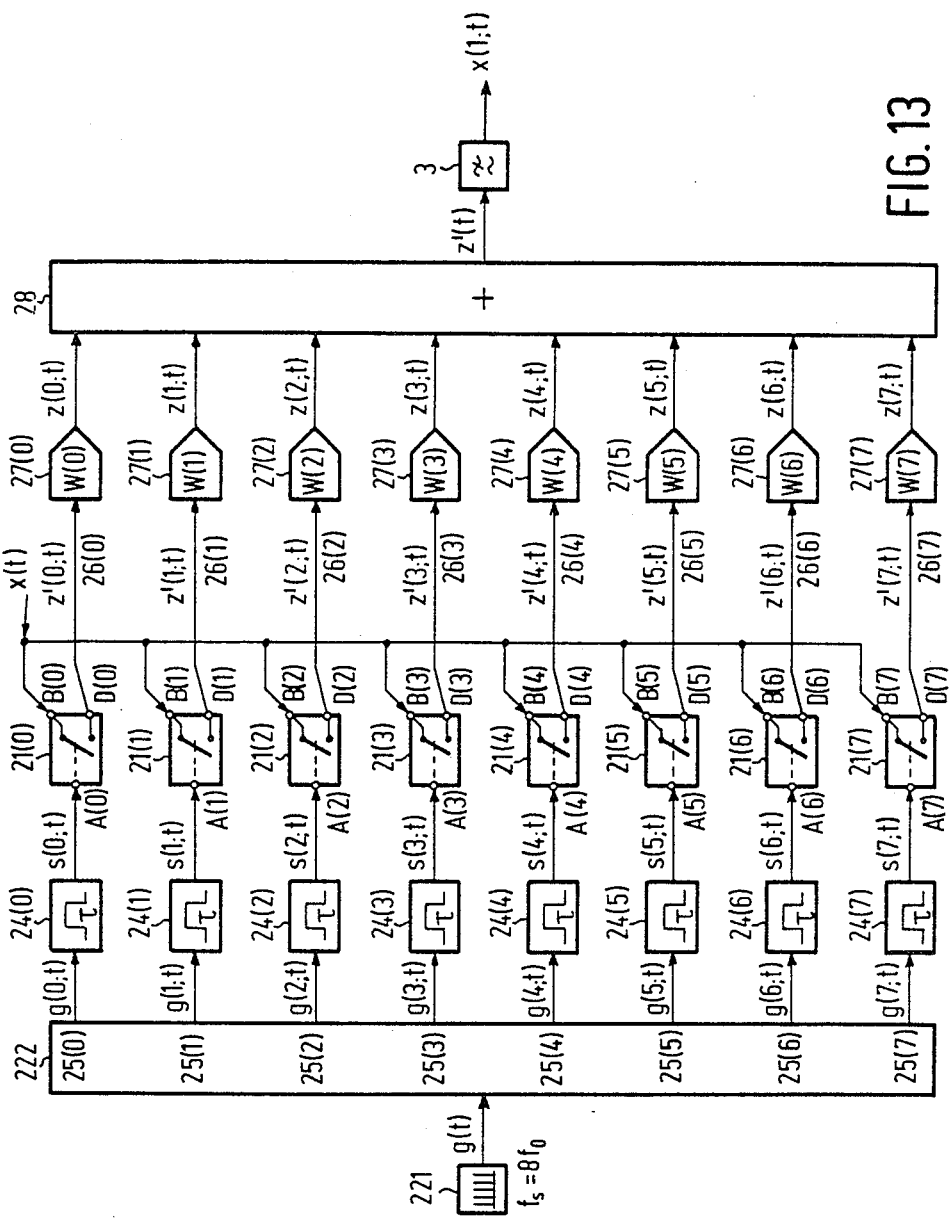
Figure 14:
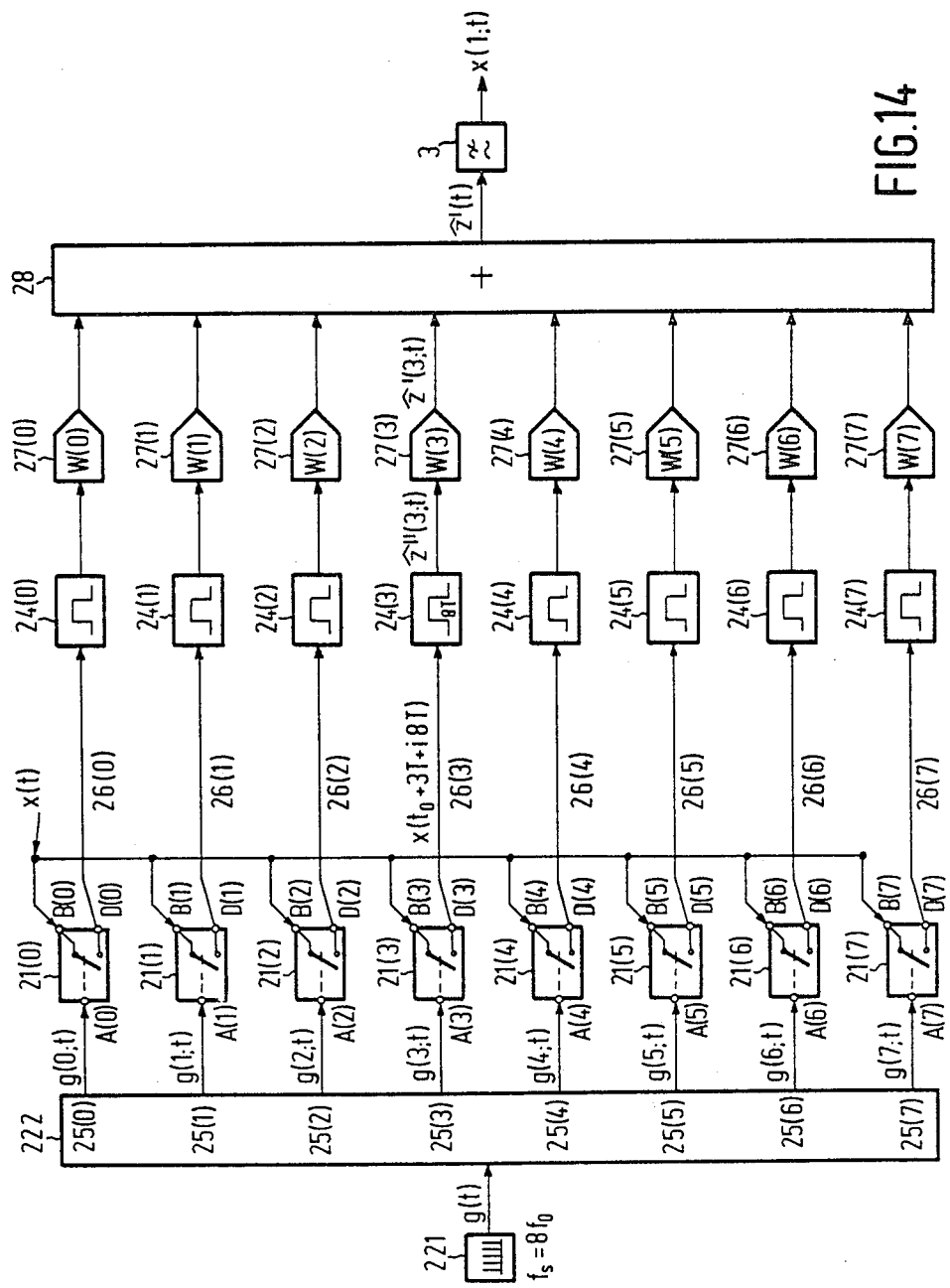
Figure 15:
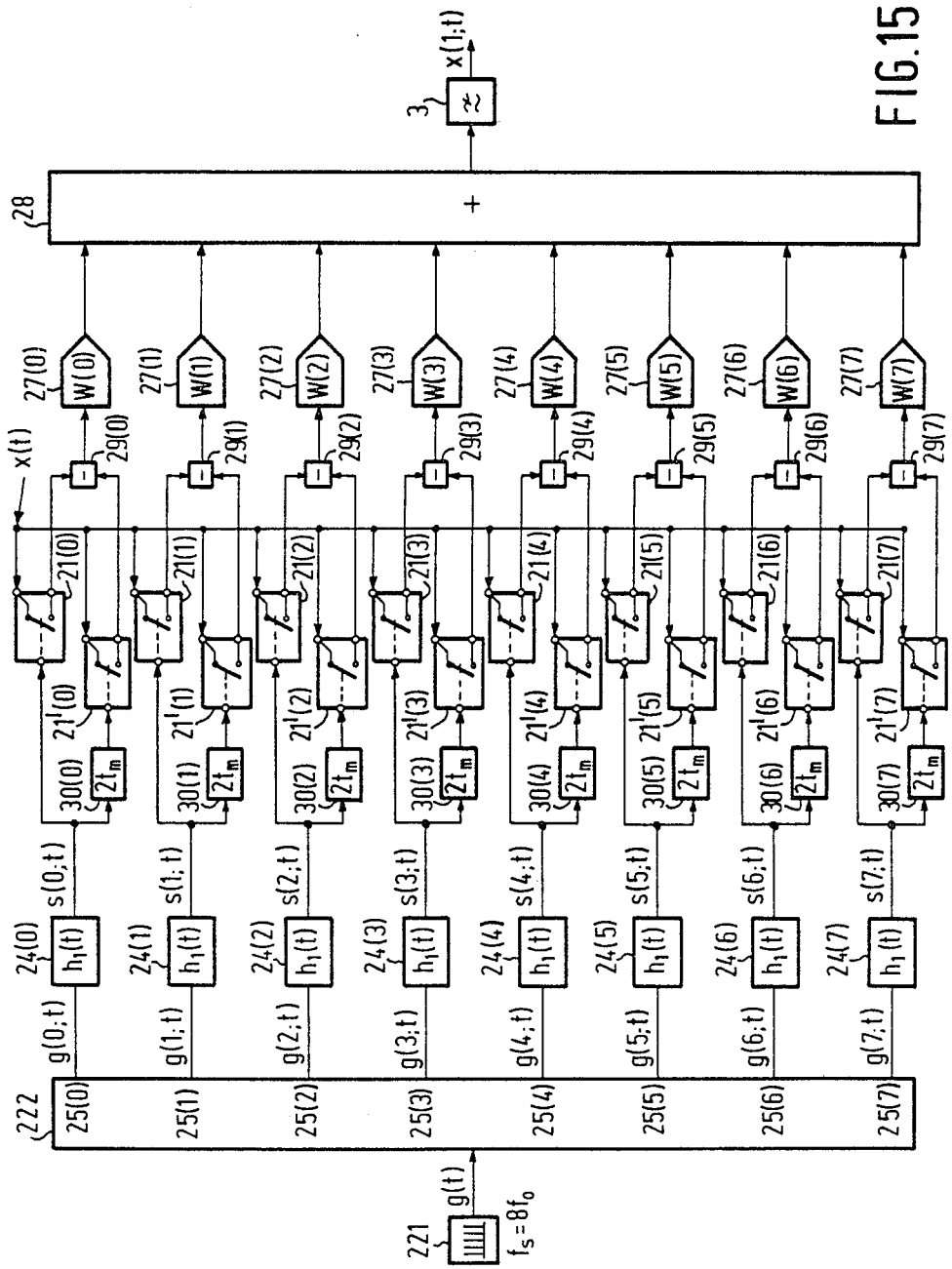
Figures 16, 17:
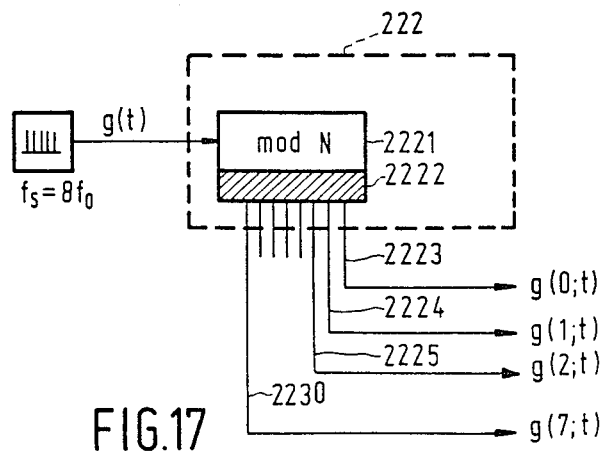
Figure 18:
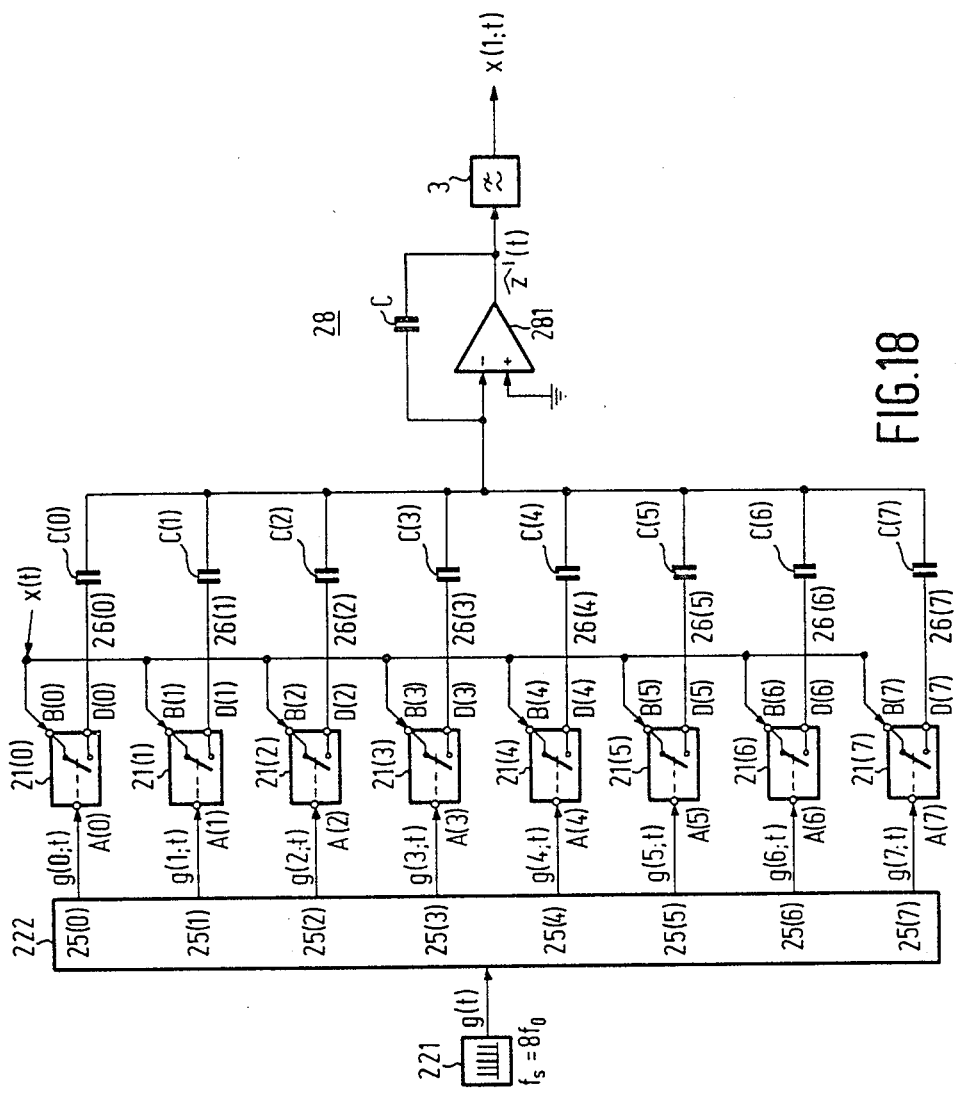
Figure 19:
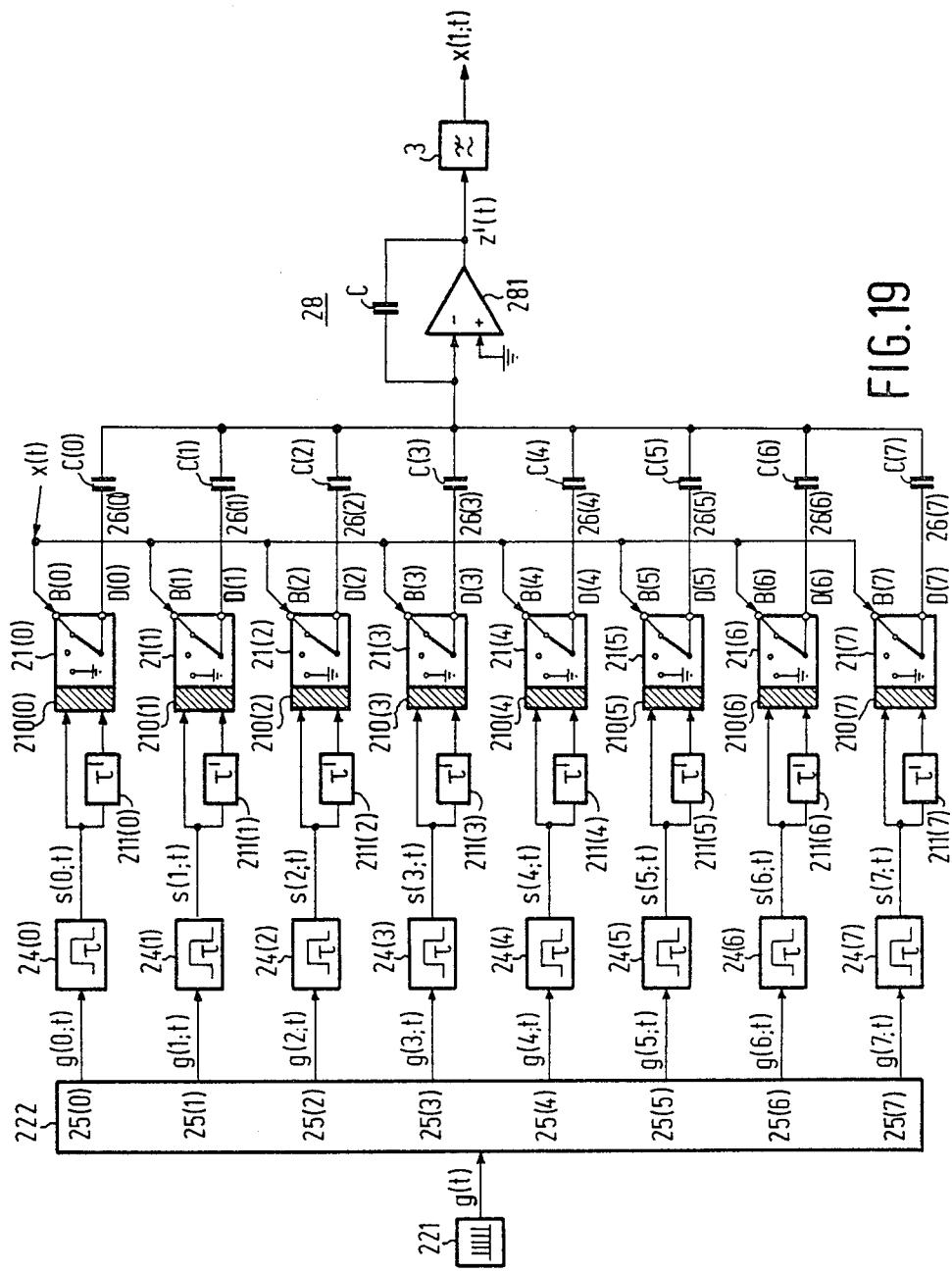

FIG. 13, FIG. 14 and FIG. 15 each show schematically a practical embodiment of the multiplier circuit;

FIG. 16 shows in a Table the possible values of the weighting factors which may be used in the embodiments shown in the FIGS. 13, 14 and 15;

FIG. 17 shows a circuit for generating the several clock pulses necessary in the embodiments shown in the FIGS. 13, 14, 15, 18 and 19;

FIG. 18 and FIG. 19 each show an embodiment of the multiplier circuit which is particularly suitable for implementation in an IC using MOS technology.

DESCRIPTION OF THE EMBODIMENTS

(1) Introduction

Figure 1:
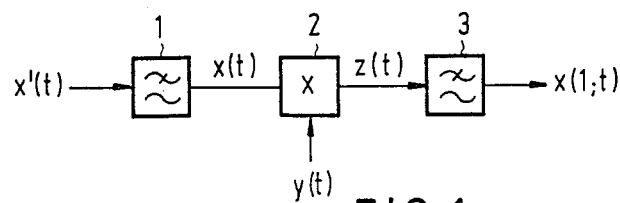
FIG. 1 shows schematically the structure of an amplitude demodulator.

In this paragraph a number of embodiments of the multiplier circuit for use in an amplitude demodulator for, for example, a stereo decoder or a phase-locked loop will be described. As mentioned hereinbefore and as shown schematically in FIG. 1, an amplitude demodulator generally comprises a premodulation filter 1, a multiplier circuit 2 and a post-modulation filter 3. The received information x'(t) is applied to this pre-modulation filter, which produces the signal x(t). In the multiplier circuit 2 x(t) is multiplied by the carrier signal y(t), which results in the product signal $z(t)=x(t)\cdot y(t)$. This product signal is filtered by the post-modulation filter 3, which thus, for example produces the output signal x(1;t).

If this amplitude demodulator is used in a stereo decoder, then the signal x'(t) applied thereto and defined in expression (1) satisfies the expressions:

$$X(0;t) = L(t) + R(t)$$

$$X(f_o;t) + \{L(t) - R(t)\} \sin(2\pi f_o t + \phi) \quad (9)$$

The sum of these signals is called stereo multiplex signal and is denoted MPX(t). It thus satisfies the expression:

$$MPX(t) = \{L(t) + R(t)\} + \{L(t) - R(t)\} \sin(2\pi f_o t + \phi) \quad (10)$$

As mentioned earlier, the frequency $f_o$ is equal to 38 kHz. If now this stereo multiplex signal is multiplied by a carrier signal having the following general form:

$$y(t) = p + q \sin(2\pi f_o t + \phi) \quad (11)$$

wherein p and q represent constants, then the product signal z(t) includes in the AF-band
either the signal L(t), namely when p=1 and q=2
or the signal R(t), namely when p=1 and q=−2
or the signal L(t)−R(t), namely when p=0 and q=1.

In the last-mentioned case the sum signal L(t)+R(t) can be separated from the stereo multiplex signal MPX(t) by means of a low-pass filter. If this sum signal and the difference signal are applied to a circuit which is commonly referred to as a matrix circuit, then this matrix circuit produces the left-hand and the right-hand signals separated from each other.

(2) Theoretical background of the invention

In order to enable a mathematical description of the theoretical background of the present invention a quantity g(arg) is introduced, which is defined as follows:

$$g(arg) = \begin{cases} 1 \text{ for } arg = 0 \\ 0 \text{ for } arg \neq 0 \end{cases} \quad (12)$$

Now the invention is based on the following notion. Let it be assumed that the carrier signal y(t) is sampled at a rate $f_s = 1/T$. This means that y(t) is multiplied by a sequence of sampling pulses g(t) which can mathematically be represented by the expression $$g(t) = \sum_{i=-\infty}^{\infty} \hat{g}(t - iT - t_o) \quad (13)$$

Herein $t_o$ represents a constant.

If now the sampled version of y(t) is represented by $\hat{y}(t)$, then it holds that:

$$\hat{y}(t) = \sum_{i=-\infty}^{\infty} y(iT + t_o)\hat{g}(t - iT - t_o) \quad (14)$$

If now this signal is applied together with x(t) to a multiplier, then the multiplier produces the product signal $\hat{z}(t)$ for which it holds that:

$$\hat{z}(t) = x(t)\hat{y}(t) \quad (15)$$

Figure 2:
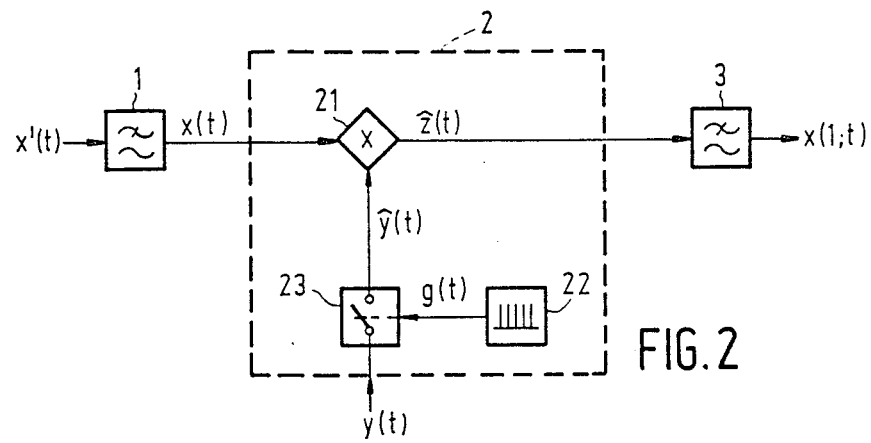
FIG. 2 shows schematically a first means for implementing a multiplier circuit for use in the amplitude demodulator of FIG. 1.

The line of thoughts described above is schematically illustrated in FIG. 2. Therein, reference numeral 2 denotes again the multiplier circuit. This multiplier circuit is formed by a multiplier 21, a clock pulse generator 22 producing the sequence of sampling pulses g(t) and a sampling circuit 23 in which y(t) is sampled and which thus produces $\hat{y}(t)$.

If, in the manner indicated in expression (2), x(t) contains a plurality of signals then the above idea has, however, serious disadvantages. To understand this the frequency spectra $\hat{y}(f)$ of $\hat{y}(t)$ wherein y(t) is given by expression (11), will be considered. As is known, this frequency spectrum consists of spectral lines with frequencies:

$if_s - f_o$ $if_s$ $if_s + f_o$ (16)

$i = \ldots -2, -1, 0, 1, 2, 3, \ldots$

If $f_s = Bf_o$, the spectral lines will have the following frequencies $(iB-1)f_o$ $iBf_o$ $(iB+1)f_o$ (17)

Figure 3:
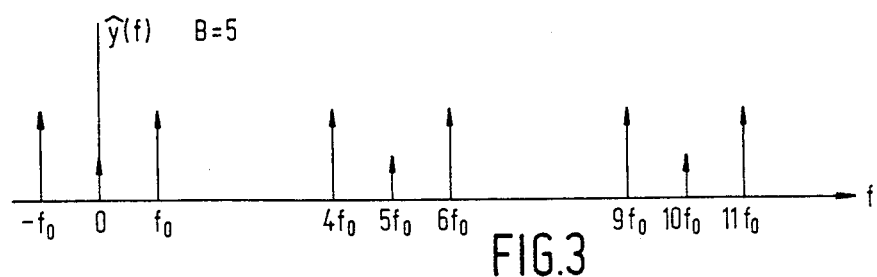
FIG. 3 and FIG. 4 show frequency spectra of some time-discrete signals.

If now B=5, then Y(f) has spectral lines at the frequencies 0, $f_o$, $4f_o$, $5f_o$, $6f_o$, $9f_o$, ... This case is schematically shown in FIG. 3. If now this signal is applied as a carrier signal to the multiplier shown in FIG. 2, then a large number of signals $X(nf_o;t)$ present in x(t) are converted to the AF-band.

Figure 4:
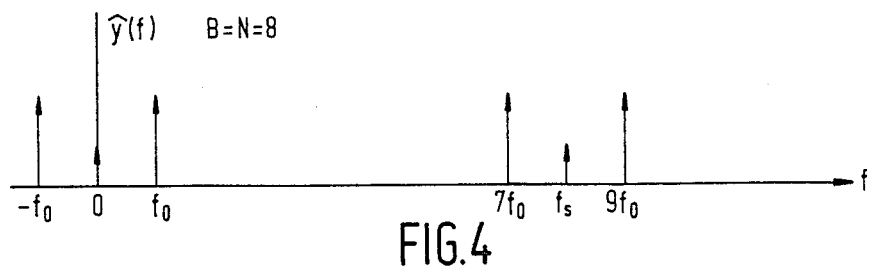

As x(t) contains only a limited number of signals $X(nf_o;t)$ owing to the use of a simple pre-modulation filter, it is yet possible in a simple mnner to prevent signals other than the desired signal from being converted to the AF-band; namely by assigning to $f_s$ a value in accordance with $f_s = Nf_o$ (18)

wherein, as appears from expression (2), N is equal to the number of signals $X(nf_o;t)$ included in x(t). As the spectral lines of $\hat{y}(f)$ now have the frequencies 0, $f_o$, $(N-1)f_o$, $Nf_o$, $(N+1)f_o$, $(2N-1)f_o$, $2Nf_o$, $(2N+1)f_o$, ... the signals $X(nf_o;t)$ wherein n=2, 3, 4, ... N−2 are not converted to the AF-band. For the sake of completeness, the frequency spectrum $\hat{Y}(f)$ is schematically shown in FIG. 4 for the case N=8.

Figure 5:
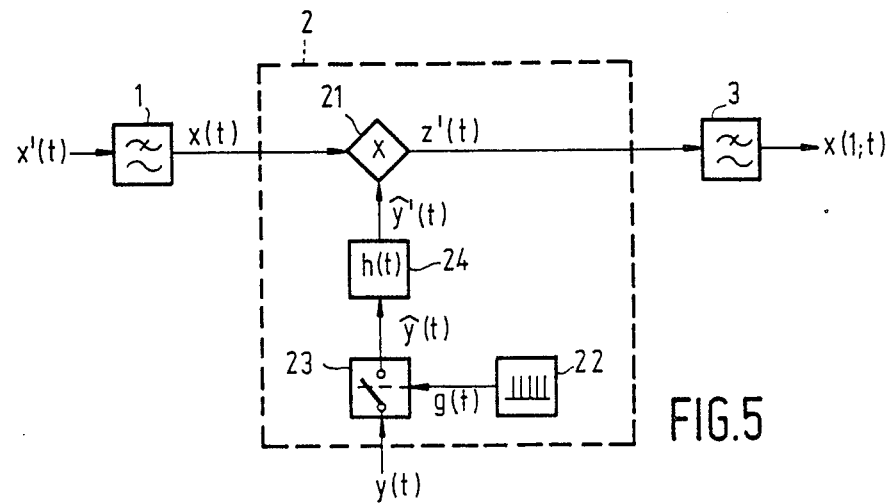
FIG. 5 and FIG. 6 show symbolically a second and a third means, respectively for implementing the multiplier circuit, wherein use is made of a pulse reshaping circuit.
Figure 6:
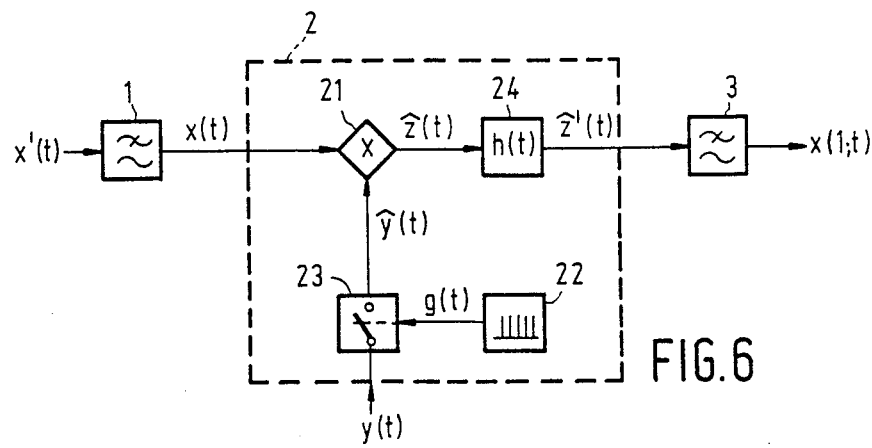

As $\hat{y}(t)$ and consequently also $\hat{z}(t)$ is formed by a sequence of pulses whose pulse width is very small, the product signal $\hat{z}(t)$ has an energy content which is not sufficient for practical uses. In order to bring this energy content to an acceptable level either $\hat{y}(t)$ or $\hat{z}(t)$ must be converted by means of a pulse reshaping circuit into a signal $\hat{y}'(t)$ and $\hat{z}'(t)$, respectively consisting of pulses having a finiture duration. This idea is schematically shown in FIGS. 5 and 6 in which the pulse reshaping circuit is represented by the element having reference numeral 24. Considered mathematically, this means that $\hat{y}(t)$ and $\hat{z}(t)$, respectively must be convolved with the impulse response h(t) of the pulse reshaping circuit so that, as is known, it holds that:

$$y'(t) = \int_{-\infty}^{\infty} y(w) h(t-w) dw \quad (19)$$

and $z'(t) = \int_{-\infty}^{\infty} z(w) h(t-w) dw$, respectively.

If now the frequency spectrum of $\hat{y}'(t)$ is designated by $\hat{Y}'(f)$, the frequency spectrum of $\hat{y}(t)$ by $\hat{Y}(f)$, the frequency spectrum of $\hat{z}'(t)$ by $\hat{Z}'(f)$ and the frequency spectrum of $\hat{z}(t)$ by $\hat{Z}(f)$ and if the transfer function of the pulse reshaping circuit is represented by H(f), then it holds, as is known, that:

$\hat{Y}'(f) = \hat{Y}(f)H(f)$ $\hat{Z}'(f) = \hat{Z}(f)H(f)$ (20)

Thus, zero points of H(f) are also zero points of $\hat{Y}'(f)$ and $\hat{Z}'(f)$, respectively.

(2) Some examples of possible impulse responses

Figure 7:
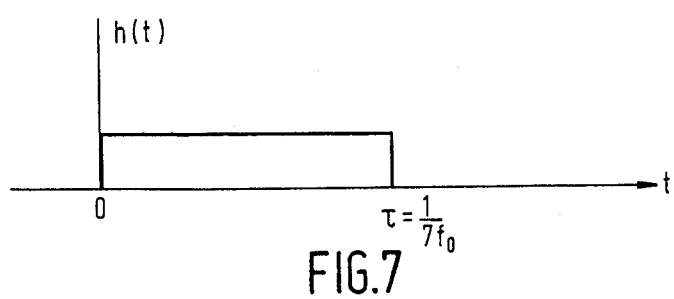
FIG. 7 shows a possible impulse response of the pulse reshaping circuit.

For the impulse response of the pulse reshaping circuit 24 the pulse shown in FIG. 7 may be selected. If the pulse width of this pule is assumed to be equal to $\tau$, then this impulse response h(t) can be mathematically represented by the expression $$h(t) = \begin{cases} 1 \text{ for } 0 \leq t \leq \tau \\ 0 \text{ for } t < 0 \text{ and } t > \tau \end{cases} \quad (21)$$

As is known, the frequency spectrum H(f) of h(t) is defined by the expression $$H(f) = 2 \frac{\sin(2\pi f \tau/2)}{2\pi f} \exp(-2\pi j f \tau/2) \quad (22)$$

Figure 8:
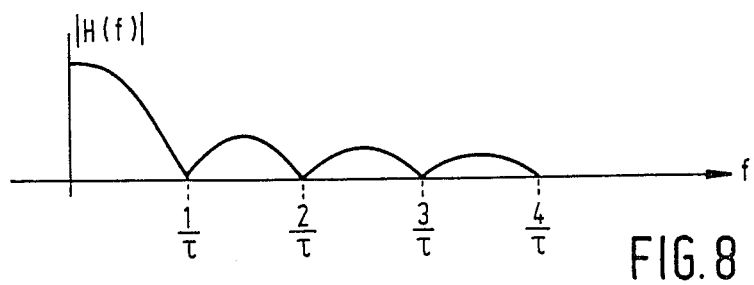
FIG. 8 shows the frequency spectrum of that impulse response.

The amplitude characteristic |H(f)| of this frequency spectrum is shown in FIG. 8. As appears therefrom, it has zero points for those frequencies f for which it holds that:

$f = r \cdot 1/\tau$ wherein $r = 1, 2, 3, 4, \ldots$ (23)

Figure 9:
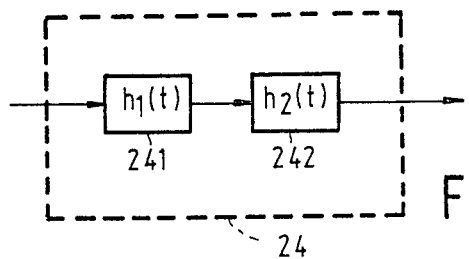
FIG. 9 shows schematically a possible construction of the pulse reshaping circuit, its impulse response being given by the convolution of two impulse responses.
Figure 10:
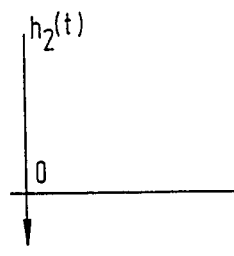
FIG. 10 shows the impulse response of one of the two impulse responses of the pulse reshaping circuit shown in FIG. 9

A different impulse response is obtained when the pulse reshaping circuit 24 would mathematically be considered as being a cascade circuit of two pulse reshaping circuits 241 and 242, as shown schematically in FIG. 9 and which have the respective impulse responses $h_1(t)$ and $h_2(t)$. The impulse response $h_1(t)$ might then, for example, be defined by expression (21) and $h_2(t)$ might be defined by the expression $h_2(t) = \hat{g}(t - 2t_m) - g(t)$ (24)

wherein $t_m$ is a predetermined quantity. This impulse response which is shown in FIG. 10 has a frequency spectrum $H_2(f)$ which is defined by the expression $H_2(f) = 2j \sin(2\pi f t_m) \exp(-2\pi j f t_m)$ (25)

wherein $j^2 = -1$

Figure 11:
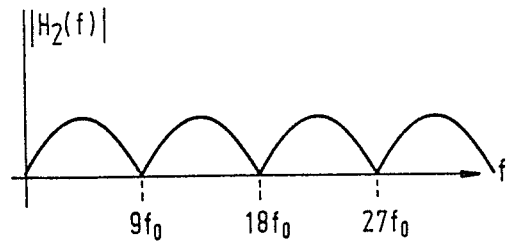
FIG. 11 shows the frequency spectrum of this impulse response.

The amplitude characteristic $|H_2(f)|$ of this frequency spectrum is shown in FIG. 11. As appears from (25), $H_2(f)$ has zero points for those frequencies f for which it holds that $$f = r \frac{1}{2t_m} \tag{26}$$

The impulse response h(t) of the pulse reshaping circuit 24 now follows from the convolution of $h_1(t)$ and $h_2(t)$, so that $$h(t) = \int_{-\infty}^{\infty} h_1(w) h_2(t - w) \, dw \tag{27}$$

Figure 12:
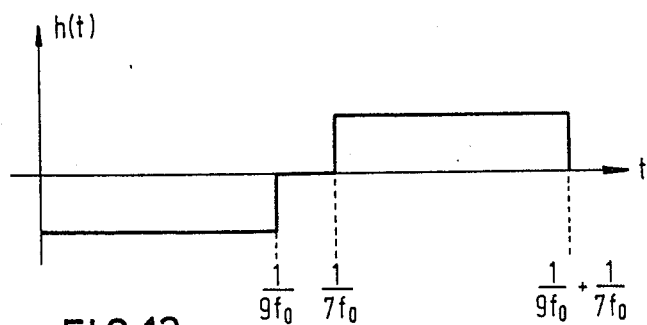
FIG. 12 represents the impulse response of the pulse reshaping circuit shown in FIG. 9, the first impulse response being given by FIG. 7 and the second impulse response by FIG. 10.

This impulse response h(t) is shown in FIG. 12. In the FIGS. 10, 11 and 12 it is assumed that $\tau = 1/(7f_o)$ and $2t_m = 1/(9f_o)$. Now the frequency spectrum H(f) of this impulse response h(t) has zero points at the frequencies $r(7f_o)$ and at the frequencies $r(9f_o)$.

(3) Some practical embodiments

Starting from the line of thoughts shown in FIG. 5, it follows from the expressions (19) and (14) that the signal z'(t) produced by the multiplier 21 is defined by:

$$z'(t) = x(t) \int_{-\infty}^{\infty} \left\{ \sum_{i=-\infty}^{\infty} y(iT+t_o)g(w-iT-t_o) \right\} h(t-w) dw \tag{28}$$

$$= x(t) \sum_{i=-\infty}^{\infty} y(iT-t_o)h(t-iT-t_o)$$

As it is assumed that y(t) is a periodic function of t and more specifically satisfies expression (11), T can be chosen so that $y(iT+t_o)$ is a periodic function of i. This will be the case if $f_s(=1/T)$ satisfies expression (18) so that:

$$y(kT+t_o) = y(kT+iNT+t_o) \tag{29}$$

wherein K = 0, 1, 2, 3, ... N−1.
Let it now be assumed that:

$$y(kT+t_o) = W(k) \tag{30}$$

then expression (28) may be written in the form:

$$z'(t) = \sum_{k=0}^{N-1} \left[ \left\{ x(t) \sum_{i=-\infty}^{\infty} h(t-kT-iNT-t_o) \right\} W(k) \right] \tag{31}$$

If now, by way of example, N is chosen to be equal to 8 then Y(f) has the frequency spectrum schematically shown in FIG. 4. By now choosing the impulse response in accordance with (21), still further frequency components of Y(f) can be suppressed. If namely $\tau = 1/(7f_o)$ it follows from FIG. 8 that the first zero point of H(f) is located at the frequency $f = 7f_o$. From (20) it follows that then also $\hat{Y}'(f)$ has a zero point at the frequency $f = 7f_o$. So now the signal $\hat{y}(t)$ does not contain any of the frequency components whose frequency amounts to $2f_o, 3f_o, 4f_o, 5f_o, 6f_o, 7f_o$, so that those signals $X(nf_o;t)$ which are located around these frequencies cannot be converted to the AF-band. This means that only a simple and extremely cheap premodulation filter 1 is required.

FIG. 13 shows an embodiment of the multiplier circuit whose operation is described by expression (31), wherein $$\sum_{i=-\infty}^{\infty} h(t - kT - iNT - t_o) = \int_{-\infty}^{\infty} \left\{ \sum_{i=-\infty}^{\infty} \hat{g}(w - kT - iNT - t_o) \right\} h(t - w) \, dw \tag{32}$$

h(t) is defined by (21).

N = 8
$\tau = 1/(7f_o)$.

This multiplier circuit comprises a clock pulse oscillator 221 which produces the sequence of sampling pulses g(t) whose frequency is $1/T = f_s = Nf_o = 8f_o$. These sampling pulses are applied to a pulse distribution circuit 222 to which N control channels 25(k) are connected. This pulse distribution circuit 222 applies to the control channel 25(k) a pulse signal g(k;t) which is defined by the expression:

$$g(k; t) = \sum_{i=-\infty}^{\infty} \hat{g}(t - kT - iNT - t_o) \tag{33}$$

This pulse signal is thereafter applied to the pulse reshaping circuit 24(k) which has the impulse response h(t) and thus produces the pulse signal s(k;t) which is defined by the expression:

$$s(k; t) = \sum_{i=-\infty}^{\infty} h(t - kT - iNT - t_o) \tag{34}$$

This pulse signal which is assumed to consist of pulses having the pulse width $\tau = 1/(7f_o) = 8/7T$ and an amplitude value 1 is applied to the control input A(k) of a switching circuit 21(k). This switching circuit further comprises an information signal input B(k) to which the information signal x(t) is applied, and which also has a signal output D(k) at which the signal z'(k;t) occurs which is defined by the expression $$z'(k;t) = x(t)s(k;t) \tag{35}$$

The output D(k) is connected to a signal channel 26(k) which comprises a weighting network 27(k) having a constant weighting factor W(k). This signal channel is further connected to an input of an adder device 28. The weighting network 27(k) produces the product signal z(k;t) which is defined by:

$$z(k;t) = W(k)z'(k;t) \tag{36}$$

The N product signals z(k;t) are added in the adder device 28 which produces the product signal z'(t).

In the foregoing it is described how the line of thought shown in FIG. 5 can be implemented. Also for the line of thoughts shown in FIG. 6 a practical embodiment is possible. To realize this embodiment it should be noted that from the expressions (19), (14), (15) and (11) it follows that:

$$z'(t) = \int_{-\infty}^{\infty} x(w) \left\{ \sum_{i=-\infty}^{\infty} y(iT+t_o)\hat{g}(w-iT-t_o) \right\} h(t-w)dw \quad (37)$$

$$= \sum_{i=-\infty}^{\infty} y(iT+t_o)x(iT+t_o)h(t-iT-t_o)$$

If the sampling rate $f_s$ again satisfies (18), then $y(iT+t_o)$ is again a periodic function of i having period NT so that expression (29) is again valid. If now also expression (30) is validated then for (37) it may be written:

$$z'(t) = \sum_{k=0}^{N-1} \left[ W(k) \sum_{i=-\infty}^{\infty} \{x(kT+iNT+t_o)h(t-kT-iNT-t_o)\} \right] \quad (38)$$

In (38) the quantities $x(kT+iNT+t_o)$ represent samples of the signal $x(t)$, these samples being taken at the instants $(k+iN)T+t_o$. If now, by way of example, $N=8$ is chosen again then $\hat{Y}(f)$ has again frequency components at $f=0$, at $f=f_o$, at $f=7f_o$ and at $f=8f_o$. If now the information signal $x(t)$ does not comprise signals at frequencies higher than, for example, $6f_o$, then the impulse response $h(t)$ of the pulse reshaping circuit 6 can be chosen so that $H(f)$ has a zero point for the frequency $f=f_o$, so that those signals present in $\hat{z}(t)$ and whose frequency spectrum is located around $f_o$ are suppressed to a considerable extent by this pulse reshaping circuit. This is already obtained by choosing the impulse response in accordance with (21) and by taking the pulse width equal to $\tau = 1/f_o = N/f_s$.

FIG. 14 shows an embodiment of the multiplying circuit whose operation is described by expression (38), it holding that:

$$x(kT+iNT+t_o) = x(t)\hat{g}(t-kT-iNT-t_o)$$

$h(t)$ is defined by (21)
$N=8$
$\tau = 1/f_o = NT$

The only difference between this multiplying circuit and the multiplying circuit shown in FIG. 13 is that the pulse reshaping circuit 24(k) is now provided between the output D(k) of the switching circuit 21(k) and the input of the weighting network 27(k). In this case this pulse reshaping circuit 24(k) produces a signal $\hat{z}''(k;t)$ which is defined by the expression $$\hat{z}''(k;t) = \sum_{i=-\infty}^{\infty} \{x(kT+iNT+t_o)h(t-kT-iNT-t_o)\} \quad (39)$$

The FIGS. 13 and 14 show embodiments of the multiplier circuit in which the impulse response of the pulse reshaping circuit is described by expression (21). If in the basic idea shown in FIG. 5 this impulse response is described by the expression (27) wherein $h_1(t)$ is defined by (21) and wherein $h_2(t)$ is defined by (24), then it holds that $h(t)$ is defined by:

$$h(t) = \int_{-\infty}^{\infty} h_1(w)h_2(t-w)dw \quad (40)$$

$$= \int_{-\infty}^{\infty} h_1(w)\hat{g}(t-2t_m-w)dw - \int_{-\infty}^{\infty} h_1(w)\hat{g}(t-w)dw$$

$$= h_1(t-2t_m) - h_1(t)$$

For the signal $z'(t)$ produced by the multiplier 21 it now holds that $$z'(t) = x(t) \int_{-\infty}^{\infty} \hat{y}(w) h(t-w) dw \quad (41)$$

$$= x(t) \sum_{i=-\infty}^{\infty} y(iT+t_o) h_1(t-2t_m-iT-t_o) +$$

$$-x(t) \sum_{i=-\infty}^{\infty} y(iT+t_o) h_1(t-iT-t_o)$$

If expression (41) is compared with (28) then this comparison will show that the multiplier circuit must now be formed by two multiplier circuits each being constructed in the manner shown in FIG. 13 and whose output signals are subtracted from each other. As these two multiplier circuits are supplied with the same signal $x(t)$ and use the same quantities $y(iT+t_o)$, these two multiplier circuits can be partly interwoven. FIG. 15 shows an embodiment obtained in this manner and which also utilizes the fact that $h_1(t=2t_m)$ represents a delayed version of $h_1(t)$. As is shown in FIG. 15 this embodiment differs from the embodiment shown in FIG. 13 in that in the channel 25(k) the output signal s(k;t) of the pulse reshaping circuit 24(k) is now not only applied to the switching circuit 21(k), but also to a second switching circuit 21'(k) via a delay device 30(k). The outputs of the two switching circuits 21(k) and 21'(k) are connected to inputs of a difference producer 29(k), the output of which is connected to the input of the weighting network 27(k). The delay device 30(k) has a time delay of $2t_m$. The switching circuit 21'(k) is of the same construction as the switching circuit 21(k) and also receives the information signal $x(t)$. The impulse response of the pulse reshaping circuit 24(k) is now equal to $h_1(t)$ and is, for example, defined by expression (21).

In the embodiment shown in the FIGS. 13 and 14 it is assumed that $N=8$. In that case $t_o=0$ can be chosen, as a result of which the weighting factors W(k) have the values shown in the Table of FIG. 16.

An embodiment of the pulse distribution circuit 222 is shown in FIG. 17. It comprises a modulo-N-counter 2221 and a decoding network 2222 having $N=8$ outputs 2223 to 2230, inclusive connected to this modulo-N-counter. More specifically, a clock pulse occurs at the output 2223 each time the counting position is 000. In the counting position 001 a clock pulse occurs at the output 2224, whereas a clock pulse occurs at the output 2225 each time the counter 2221 has the counting position 010; etc. Thus, these outputs of the decoding network 2222 supply the clock pulse signals g(0;t) g(1;t) .. . g(7;t).

The pulse reshaping circuits 24(k) used in the embodiment of FIG. 13 may be in the form of monostable multivibrators.

In the embodiment shown in FIG. 14 the switching network 21(k) acts in essence as a sampling device and the subsequent pulse reshaping circuit 24(k) acts in essence as a hold switch. The function of this cascade arrangement may therefore be realized in practice by means of a sample-and-hold circuit.

FIG. 18 shows an embodiment of the multiplier circuit constructed by means of sample-and-hold circuits and which is particularly advantageous for implementation as an IC (integrated circuit). This embodiment follows directly from the embodiment shown in FIG. 14. For that purpose, in this FIG. 14 the pulse reshaping circuit 24(k) in each signal channel 26(k) must be in the form of a capacitor having a capacitance C(k). The adder device 28 must be formed by means of an operational amplifier 281. The "−" input thereof is connected to each one of the capacitors C(k) and the "+" input is connected to ground. The output of this amplifier 281 supplies the signal $\hat{z}'(t)$ and is also connected to its "−" input via a capacitor having a capacitance C. This embodiment operates as follows. When, owing to the occurrence of a sampling pulse in g(k;t) the sampling device 21(k) is briefly closed, a charge quantity Q(k) is applied to the capacitor C(k) until the voltage V(k) across C(k) is equal to the instantaneous value $x(kT+iNT+t_o)$ of x(t), so that $$Q(k) = C(k)V(k) \qquad (42)$$

Owing to the use of the operational amplifier 281 a charge −Q(k) is withdrawn from capacitor C, so that across this capacitor there is a voltage −V for which it holds that:

$$-Q(k) = CV \qquad (43)$$

From (42) and (43) it then follows that:

$$V = -\frac{C(k)}{C} V(k) \qquad (44)$$

so that the weighting factors W(k) are now determined by the ratio between two capacitances. The desired ratio can be realized very accurately in integrated circuits.

A particularly advantageous construction of the embodiment shown in FIG. 13 is shown in FIG. 19. In addition to the fact that in this embodiment each control channel 25(k) comprises a pulse reshaping circuit 24(k) this embodiment differs from the embodiment in FIG. 18 in that each switching circuit 21(k) is in the form of a three-position switch. This switching circuit comprises a control circuit 210(k) to which the signal s(k;t) and also a delayed version s(k;t=τ') thereof, are applied. This delayed version is obtained by using a delay device 211(k) having a time delay τ' which is at least equal to τ. This control circuit operates therefore as follows: When s(k;t)=1 the output D(k) of the switching circuit is connected to its signal input B(k) so that the voltage across the capacitor C follows the signal x(t) and it consequently holds that:

$$z'(t) = \frac{C(k)}{C} \cdot x(t) \qquad (45)$$

When $s(k;t)=s(k;t-\tau')=0$ the switch is in a neutral position as a result of which the voltage across C(k) is maintained. So this may be considered to be a hold effect. When $s(k;t)=0$ and $s(k,t-\tau')=1$, the output D(k) is connected to ground causing the capacitor C(k) to be discharged and the same quantity of charge to be withdrawn from the capacitor C.

Because of the above-mentioned hold effect a portion of the filter operation to be realized by the filter 3 is now realized in a simple manner by the multiplier circuit itself, so that now also this post-modulation filter 3 may be of a simpler construction.

(4) General remarks

1. As can be seen from the Table of FIG. 16 it holds that for the case p=0 and q=1 both W(0)=0 and W(4)=0. In such a case the associated control channels, signal channels and switching circuits need not be physically present.

2. It is not only possible to realize the weighting factors W(k) by means of weighting networks 27(k) such as resistor networks but they can also be realized by means of amplifiers.

3. If in two signal channels the same weighting factor would be used and the control pulses occurring in the associated control channels are not simultaneously present then these channels may be combined. The two pulse signals may then, namely, be applied to the same control channel. Consequently, one switching circuit and one weighting network may be omitted.

4. As appears from, for example, the third and fourth columns of FIG. 16, it is possible to consider the weighting factors, or a number of them, as the sum (or the difference) of a number of factors which may be called basic weighting factors (the weighting factors 1 and $\sqrt{2}$ in FIG. 16 might, for example, be basic weighting factors). If this is the case, then each weighting network may be in the form of a parallel arrangement of a plurality of basic weighting networks, each having a basic weighting factor. If now the same basic weighting factors were used in two or more signal channels and the control pulses occurring in the associated control channels are not simultaneously present, then those portions of the signal channels having the same basic weighting factors may be combined. This results in a significant reduction in the number of weighting networks.

What is claimed is:

1. A multiplier circuit for multiplying an information signal x(t) by a periodic signal y(t) having a period $1/f_o$, comprising:
   a. pulse generator circuit for generating a group of N pulse signals g(k;t) on N pulse channels 25(k) of the generator circuit wherein k=0, 1, 2, 3, ... N−1, N being at least equal to three and wherein
      a.1. each group of N pulse signals has a group pulse repetition rate $T_o1/f_o$;
      a.2. the pulses in the group of pulse signals g(k;t) occur at instants $t_o+k\ T_o/N+iT_o$, wherein $t_o$ represents a constant and i= ... −2, −1, 0, 1, 2, ...;
   b. N switching circuits 21(k) each having:
      b.1. a control input A(k) which is coupled to the control channel 25(k) of the pulse generator, the pulse signal g(k;t) being applied to this control channel;
      b.2. an information signal input B(k) for receiving the information signal x(t);
      b.3. a signal channel 26(k) for carrying a signal output D(k),
   c. N weighting networks 27(k) each network having a constant weighting factor W(k) defined by the relation $W(k)=y(t_o+k\ T_o/N)$, each weighting network being coupled to a one of the signal channels and generating a product signal, d. an adder device 28 connected to each one of the signal channels of the weighting networks for adding the product signals together;

e. N pulse reshaping circuits 24(k) for converting a pulse applied thereto into a pulse whose width $\tau$ is equal to an integral fraction times $1/f_o$, each pulse reshaping circuit being coupled to a one of the switching circuits.

2. A multiplier circuit as claimed in claim 1, in which each of the weighting networks 27(k) has a weighting factor W(k) defined by the expression $$W(k) = y\left(t_o + k\frac{T_o}{N}\right) = p + q \sin\left\{2\pi f_o\left(t_o + k\frac{T_o}{N}\right) + \phi\right\}$$

wherein p, q and $\phi$ represent constants.

3. A multiplier circuit as claimed in claim 1, in which each of the pulse reshaping circuits is coupled to a one of the signal channels and forms a sample-and-hold circuit with the associated switching circuit.

4. A multiplier circuit as claimed in claim 1, in which each of the pulse reshaping circuits is coupled to a one of the signal channels and is formed by a capacitor having two poles, one pole being coupled to receive the signal output D(k) of the associated switching circuit and the other pole being coupled to a junction which is common to all capacitors.

5. A multiplier circuit as claimed in claim 1, in which each of the pulse reshaping circuits is coupled to a one of the control channels and each one of the signal channels is coupled to a capacitor having two poles, one pole being connected to the signal output D(k) of the associated signal channel of the switching circuit and the other pole being connected to a junction point which is common to all capacitors.

6. A multiplier circuit as claimed in claim 4 or claim 5, in which the adder device 28 is connected to the said common junction and is formed by an amplifier circuit by-passed by a capacitor.

7. A multiplier circuit as claimed in claim 6, in which the weighting factor W(k) in a signal channel is generated by the ratio between the capacitance C(k) of the capacitor coupled to the signal channel and the capacitance C of the capacitor by-passing the amplifier circuit.

* * * * *

UNITED STATES PATENT AND TRADEMARK OFFICE
CERTIFICATE OF CORRECTION

PATENT NO. : 4,517,655

DATED : May 14, 1985

INVENTOR(S) : THEODOOR A.C.M. CLAASEN ET AL

It is certified that error appears in the above-identified patent and that said Letters Patent is hereby corrected as shown below:

Column 14, Claim 1, line 50, change "$T_0 1/f_0;$" to --$T_0 = 1/f_0;$--.

Signed and Sealed this

Twenty-fourth Day of September 1985

[SEAL]

Attest:

DONALD J. QUIGG

Attesting Officer

Commissioner of Patents and
Trademarks—Designate